United States Patent
Hao et al.

(10) Patent No.: US 12,316,331 B2
(45) Date of Patent: May 27, 2025

(54) SYNCHRONIZATION METHOD FOR MULTI-CHANNEL SIGNALS, POWER SUPPLY MODULE, ELECTRONIC DEVICE AND POWER SUPPLY DEVICE

(71) Applicant: RIGOL TECHNOLOGIES CO., LTD., Jiangsu (CN)

(72) Inventors: Huhu Hao, Suzho (CN); Yue Wang, Suzhou (CN)

(73) Assignee: RIGOL TECHNOLOGIES CO., LTD., Suzhou (CN)

( * ) Notice: Subject to any disclaimer, the term of this patent is extended or adjusted under 35 U.S.C. 154(b) by 0 days.

(21) Appl. No.: 18/519,866

(22) Filed: Nov. 27, 2023

(65) Prior Publication Data
US 2024/0106437 A1    Mar. 28, 2024

Related U.S. Application Data

(63) Continuation of application No. PCT/CN2022/094909, filed on May 25, 2022.

(30) Foreign Application Priority Data

May 28, 2021 (CN) .......................... 202110590872.8

(51) Int. Cl.
*H03L 7/00* (2006.01)
*G06F 1/10* (2006.01)
(Continued)

(52) U.S. Cl.
CPC ................. *H03L 7/00* (2013.01); *G06F 1/10* (2013.01); *H02M 1/00* (2013.01); *H04L 7/0008* (2013.01)

(58) Field of Classification Search
CPC ... H03L 7/00; G06F 1/10; H02M 1/00; H04L 7/0008
(Continued)

(56) References Cited

U.S. PATENT DOCUMENTS

2008/0163000 A1*  7/2008  McKim .......... G01R 31/318594
                                                                  714/34
2023/0032250 A1    2/2023  Luo et al.

FOREIGN PATENT DOCUMENTS

CN      102109874 A      6/2011
CN      107168458 A      9/2017
(Continued)

OTHER PUBLICATIONS

Chinese Search Report, issued in Application No. 202110590872.8, dated Dec. 31, 2021.
(Continued)

*Primary Examiner* — Arnold M Kinkead
(74) *Attorney, Agent, or Firm* — Birch, Stewart, Kolasch & Birch, LLP

(57) ABSTRACT

A synchronization method for multi-channel signals, a power supply module, an electronic device, and a power supply device. In the synchronization method for multi-channel signals, a first power supply module (700) is connected to a plurality of mutually isolated second power supply modules (800), allocates target data information and a target duration to each of the second power supply modules (800) according to total data information input by a user; and then the first power supply module (700) synchronously transmits a clock signal to each of the second power supply modules (800), so as to trigger each of the second power supply modules (800) to synchronously output a data signal corresponding to the target data information, and to control an output duration of the data signal to be equal to the target duration.

14 Claims, 4 Drawing Sheets

(51) Int. Cl.
*H02M 1/00* (2007.01)
*H04L 7/00* (2006.01)

(58) Field of Classification Search
USPC .................. 307/43; 717/128, 129; 714/25
See application file for complete search history.

(56) References Cited

FOREIGN PATENT DOCUMENTS

| | | | |
|---|---|---|---|
| CN | 108563557 | A | 9/2018 |
| CN | 109428178 | A | 3/2019 |
| CN | 110708042 | A | 1/2020 |
| CN | 110928177 | A | 3/2020 |
| CN | 111510277 | A | 8/2020 |
| CN | 111522759 | A | 8/2020 |
| CN | 111556224 | A | 8/2020 |
| CN | 112462240 | A | 3/2021 |
| CN | 113285579 | A | 8/2021 |
| JP | 2012-528498 | A | 11/2012 |
| KR | 2001-0067146 | A | 7/2001 |
| KR | 10-2010-0007764 | A | 1/2010 |
| KR | 10-2012-0127358 | A | 11/2012 |
| KR | 10-2019-0039300 | A | 4/2019 |

OTHER PUBLICATIONS

Chinese Search Report, issued in Application No. 202110590872.8, dated Mar. 29, 2022.
First Office Action, issued in Chinese Application No. 202110590872.8, dated Jan. 11, 2022.
International Search Report (PCT/ISA/210), issued in PCT/CN2022/094909, dated Aug. 5, 2022.
Written Opinion of the International Searching Authority (PCT/ISA/237), issued in PCT/CN2022/094909, dated Aug. 5, 2022.

* cited by examiner

SYNCHRONIZATION METHOD FOR MULTI-CHANNEL SIGNALS, POWER SUPPLY MODULE, ELECTRONIC DEVICE AND POWER SUPPLY DEVICE

CROSS-REFERENCE TO RELATED APPLICATIONS

The present application is a Continuation Application of International Application No, PCT/CN2022/094909, filed on May 25, 2022, which claims priority to Chinese patent application No, 202110590872.8, filed on May 28, 2021, entitled "Synchronization Method for Multi-channel Signals, Power Supply Module, Electronic Device and Power Supply Device", each of which is incorporated herein by reference in its entirety.

TECHNICAL FIELD

The present application relates to the technical field of power supply, and in particular, to a synchronization method for multi-channel signals, a power supply module, an electronic device_ and a power supply device.

BACKGROUND

The synchronous output of multi-channel signals may have a plurality of purposes. For example, when data signals output by multi-channels are voltage or current signals, the output of multi-channel signals is equivalent to the output of multi-channel power supplies. In the field of multi-channel power supplies, how to achieve synchronization is a key issue due to relative isolation of each channel.

At present, the synchronization method for multi-channel power supplies generally needs to collect a data signal corresponding to the output of each channel output device, determine a delay parameter of each channel output device, and respectively perform delay adjustment to achieve the purpose of synchronously outputting the data signal of each channel. In other words, it needs to adjust the delay parameter corresponding to each channel output device according to a test result. The development cost of this synchronization method is high, and the development cycle is also long.

SUMMARY

In view of the above, embodiments of the present application provide a synchronization method for multi-channel signals, a power supply module, an electronic device, and a power supply device in order to solve at least one problem in the background art.

In a first aspect, an embodiment of the present application provides a synchronization method for multi-channel signals, applied to a first power supply module, wherein the first power supply is connected to at least two mutually isolated second power supply modules. The method comprises:
  allocating target data information and a target duration to each of the second power supply modules according to total data information pre-input by a user; and
  synchronously transmitting a clock signal to each of the second power supply modules, and triggering each of the second power supply modules to output a data signal corresponding to the target data information with an output duration of the data signal being equal to the target duration.

In a second aspect, an embodiment of the present application provides a synchronization method for multi-channel signals, applied to a second power supply module, wherein at least two second power supply modules are mutually isolated and are connected to a first power supply module. The method comprises:
  receiving target data information and a target duration that are transmitted by the first power supply module; and
  receiving a clock signal transmitted by the first power supply module in synchronization with other second power supply modules, outputting a data signal corresponding to the target data information under the trigger of the clock signal, and controlling an output duration of the data signal to be equal to the target duration based on the clock signal.

In a third aspect, an embodiment of the present application provides a power supply module, comprising a first power supply module, wherein the first power supply module is connected to a plurality of mutually isolated second power supply modules. The first power supply module comprises:
  an allocation module, configured to allocate target data information and a target duration to each of the second power supply modules according to total data information pre-input by a user; and
  a triggering module, configured to synchronously transmit a clock signal to each of the second power supply modules, and trigger each of the second power supply modules to output a data signal corresponding to the target data information with an output duration of the data signal being equal to the target duration.

In a fourth aspect, an embodiment of the present application provides an electronic device, comprising: a memory, a processor, and a computer program stored on the memory and executable by the processor, wherein, when executed by the processor, the computer program implements steps of the method as described in any one of the above embodiments.

In a fifth aspect, an embodiment of the present application provides a computer-readable storage medium, wherein the computer-readable storage medium is stored with a computer program, wherein, when executed by a processor, the computer program implements steps of the method as described in any one of the above embodiments.

In a sixth aspect, an embodiment of the present application provides a power supply device, comprising a power supply module as described above, and a second power supply module connected to the first power supply module in the power supply module; wherein the first power supply module comprises a microprocessor, and the second power supply module comprises a sub-channel board, wherein the sub-channel board comprises a serial interface, a field programmable gate array (FPGA) chip, a digital-to-analogue converter (DAC), an analogue-to-digital converter (ADC), a storage unit and an isolated power supply, and wherein the microprocessor transmits data to the sub-channel board via the serial interface.

In the synchronization method for multi-channel signals, the power supply module, the electronic device and the power supply device provided in the embodiments of the present application, the first power supply module is connected to a plurality of mutually isolated second power supply modules, allocates target data information and a target duration to each of the second power supply modules according to total data information input by a user; and then the first power supply module synchronously transmits a clock signal to each of the second power supply modules so as to trigger each of the second power supply modules to synchronously output a data signal corresponding to the target data information, and to control the output duration of the data signal to be equal to the target duration, thereby achieving synchronization of the data signals output by the second power supply modules. Compared with the method of adjusting the delay parameter of each power supply device according to a test result of each power supply device in the prior art, the synchronization method for multi-channel signals provided in the embodiments of the present application does not require to perform a test every time the synchronization of multi-channel signals is needed, thereby reducing the synchronization costs and synchronization adjustment time of multi-channel signals.

BRIEF DESCRIPTION OF DRAWINGS

The accompanying drawings provided herein serve to provide a further understanding of the present application and constitute a part of the present application. The illustrative embodiments and the description thereof in the present application serve to explain the present application and do not constitute any undue limitation on the present application. In the drawings.

DESCRIPTION OF THE REFERENCE NUMBERS

700—First power supply module; 710—Allocation module; 720—Triggering module;
800—Second power supply module; 810—Receiving module; 820—Output module.

DETAILED DESCRIPTION

To make the objects, technical solutions, and advantages of the present application clearer, the technical solutions of the present application will be clearly and completely described below with reference to the embodiments of the present application and the accompanying drawings. It is apparent that the described embodiments are only part embodiments of the present application, and not all embodiments. Based on the embodiments in the present application, all other embodiments obtained by a person skilled in the art without involving any inventive effort are within the scope of protection of the present application.

The terminology used herein is for the purpose of describing the embodiments only and is not intended to limit the present application. As used herein, the singular forms "a", "an", and "the" are intended to include the plural forms as well, unless the context clearly indicates otherwise. It will be further understood that the term "comprise/include", when used in this specification, specify the presence of the features, integers, steps, operations, elements, and/or components, but do not preclude the presence or addition of one or more other features, integers, steps, operations, elements, components, and/or sets thereof. As used herein, the term "and/or" includes any and all combinations of the associated listed items.

It will be understood that when a structure is referred to as being "connected" or "coupled" to other structure, it may be directly connected or coupled to the other structure, or intervening structures may be present. In contrast, when a structure is referred to as being "directly connected" or "directly coupled" to other structure, there are no intervening structures present. It will be understood that, although the terms first, second, third, etc., may be used to describe various elements, components, regions, layers and/or portions, these elements, components, regions, layers and/or portions should not be limited by these terms. These terms are only used to distinguish one from another. Thus, a first element, component, region, layer, or portion discussed below could be termed a second element, component, region, layer or portion without departing from the teachings of the present application. However, the discussion of a second element, component, region, layer, or portion does not imply that a first element, component, region, layer, or portion is necessarily present in the present application.

Figure 1:
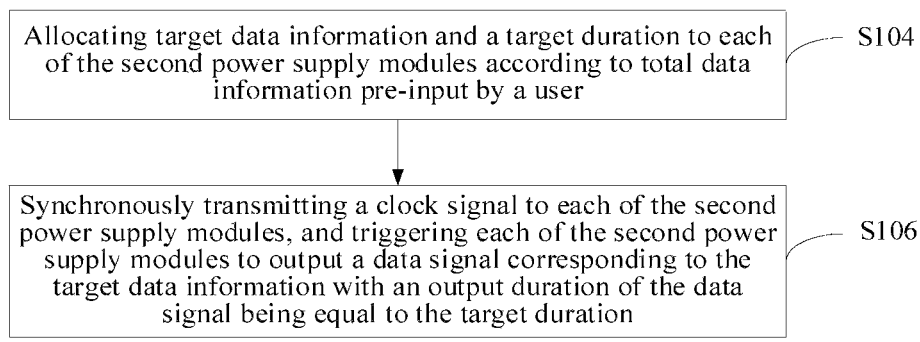
FIG. 1 is a flowchart illustrating a first synchronization method for multi-channel signals according to an embodiment of the present application.

As shown in FIG. 1, a first implementation of a synchronization method for multi-channel signals according to an embodiment of the present application may be applied to a first power supply module, which is connected to a plurality of second power supply modules that are mutually isolated, in which the first power supply module may be a host in a power supply system, and the second power supply module may be a slave in a power supply device. As shown in FIG. 1, the synchronization method includes the following steps:

S104: Allocating target data information and a target duration to each of the second power supply modules according to total data information pre-input by a user. The second power supply module thereafter outputs a corresponding data signal according to the target data information, and a duration of the data signal should be equal to the target duration allocated to the second power supply module.

S106: Synchronously transmitting a clock signal to each of the second power supply modules, and triggering each of the second power supply modules to output a data signal corresponding to the target data information with an output duration of the data signal being equal to the target duration.

Compared with the adjustment of the delay parameter of each power supply device according to a test result of each power supply device in the prior art, the synchronization method for multi-channel signals provided in the embodiments of the present application does not require to perform a test every time the synchronization of multi-channel signals is needed, thereby reducing the synchronization costs and synchronization adjustment time of multi-channel signals.

The total data information pre-input by the user may be directly input by the user to the first power supply module, or may be read and received by the first power supply module after being input by the user to the second power supply module. The first power supply module may include an input device, such as a touch interface, a keyboard, a mouse, etc., and correspondingly, the second power supply module may include an input device, such as a touch interface, a keyboard, a mouse, etc. The user inputs the total data information via these input devices.

After acquiring the total data information pre-input by the user, the first power supply module parses the total data information to obtain an allocation scheme, and allocates the target data information and target durations to the second power supply modules.

The target data information allocated to each of the second power supply modules by the first power supply module may be completely different, or may be partially same or completely same, while the target durations of all the second power supply modules are same, thereby enabling the output durations of the data signals output by the second power supply modules to be same.

The frequency of the clock signal synchronously transmitted to each of the second power supply modules may be set according to demands, for example, 10 KHz, 5 KHz, or 15 KHz, etc. It may be appointed that the $N^{th}$ (N being 1, 2, 3, etc.) rising edge or falling edge of the clock signal triggers the second power supply modules to output data signals. Since the clock signal is synchronously transmitted to the second power supply modules, each of the second power supply modules simultaneously outputs a corresponding data signal under the trigger of the clock signal, and times the output duration of the data signal according to the clock signal, so that the output duration is equal to the target duration. As the target duration allocated to each of the second power supply modules is same, the data signal output by each of the second power supply modules is cut off at the same time, and thus the purpose of synchronizing the data signals output by all the second power supply module is achieved.

The total data information includes at least one of the following of the data signal output by the second power supply module: a type, a waveform, a frequency, an average value, an effective value, or an amplitude. The type of the data signal may include a voltage signal and/or a current signal, and the waveform may be a sine wave, a rectangular wave, etc. When the type, the waveform, the frequency, etc., are included in the total data information, it means that the type, the waveform, the frequency, etc., can be selected; when the type, the waveform, the frequency, etc., are not included in the total data information, it means that the type, the waveform, the frequency, etc., are default. When the type of the data signal is a voltage signal, the effective value may be 10 volts, 5 volts, or 3 volts, etc. Further, the target duration may be 5 seconds, 30 seconds, 60 seconds, etc.

In an embodiment of the present application, the total data information input by the user may further includes at least one of the following: number of sets of data in the target data information for each of the second power supply modules, a duration of each set of data in the target data information, number of cycles of the data signal, or a termination state of the second power supply module. The number of sets of data in the target data information for each of the second power supply modules may be one, two, three or more, and each of the second power supply modules correspondingly outputs a respective signal according to each set of data in the target data information, namely, each set of data corresponds to a respective signal, and the duration corresponding to each set of data may be same or different. The number of cycles of the data signal may be one, two, three or more, and after the output of the signal corresponding to each set of data in the target data information is completed for the first time, the signal corresponding to each set of data is output cyclically according to the number of cycles. The total number of signals output by each of second power supply modules is equal to a product of the number of sets of data in the target data information for each of the second power supply modules and the number of cycles. In a case where the duration corresponding to each set of data in the target data information is same, a product of the duration corresponding to each set of data and the number of sets of data in the target data information and the number of cycles is equal to the target duration corresponding to the target data information.

The termination state of the second power supply module refers to a state in which the second power supply module has completed the output of the total number of signals determined according to the total data information when the number of cycles is a limited value. The termination state includes turning off the output, or holding a signal corresponding to a last set of data in the target data information. Turning off the output means the output signal is zero, in other words, no signal is output. If a signal corresponding to the last set of data is a voltage signal having an effective value of 5 volts, or a current signal having an effective value of 1 ampere, and the termination state is selected to be a state of the signal corresponding to the last set of data in the target data information, the termination state is a voltage of 5 volts or a current of 1 ampere.

Figure 2:
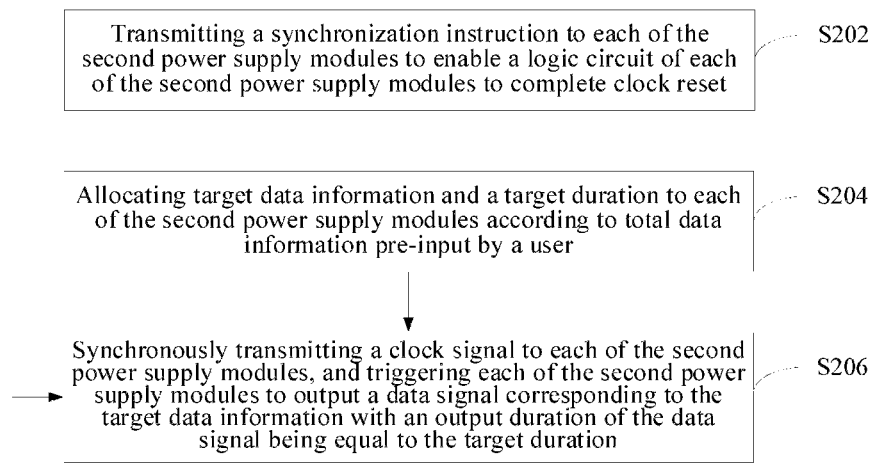
FIG. 2 is a flowchart illustrating a second synchronization method for multi-channel signals according to an embodiment of the present application.

As shown in FIG. 2, a second implementation of the synchronization method according to an embodiment of the present application includes the following steps: S202, S204 and S206. In addition, the order of S202 and S204 may be that S202 precedes S204, S204 precedes S202, or S202 and S204 are performed simultaneously, which is not particularly limited in the embodiments of the present application.

S202: Transmitting a synchronization instruction to each of the second power supply modules to enable a logic circuit of each of the second power supply modules to complete clock reset. After the clock is reset, all bits of the clock in the logic circuit of the second power supply module are set to zero. The synchronization instruction transmitted by the first power supply module to the second power supply module may be transmitted via a serial port, and the serial port may be a Serial Peripheral Interface (SPI), an Inter IC Bus (I2C), or a Universal Asynchronous Receiver Transmitter (URAT). In addition, other communications between the first power supply module and the second power supply module may also be achieved by means of the above-mentioned serial port. Of course, data transmission between the first power supply module and the second power supply module may be achieved in other ways instead of using the serial port.

S204: Allocating target data information and a target duration to each of the second power supply modules according to total data information pre-input by a user.

S206: Synchronously transmitting a clock signal to each of the second power supply modules, and triggering each of the second power supply modules to output a data signal corresponding to the target data information with an output duration of the data signal being equal to the target duration.

S204 may refer to S104, and S206 may refer to S106, which will not be described repeatedly herein.

Figure 3:
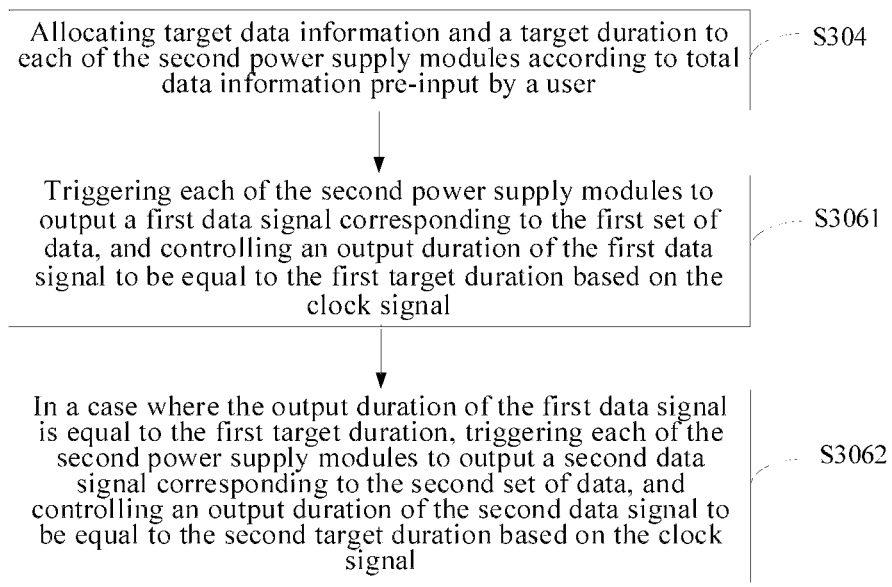
FIG. 3 is a flowchart illustrating a third synchronization method for multi-channel signals according to an embodiment of the present application.

As shown in FIG. 3, a third implementation of the synchronization method according to an embodiment of the present application includes the following steps: S304 and S306.

S304: Allocating target data information and a target duration to each of the second power supply modules according to total data information pre-input by a user.

The target data information includes at least two sets (for example, two sets, three sets, four sets, etc.) of data and at least two sets (for example, two sets, three sets, four sets, etc.) of corresponding durations. In S306, data signals corresponding to each of several sets of data in the target data information are output in sequence according to the durations corresponding to the several sets of data, and the completion of the output of a previous set of data signals automatically triggers the output of a next set of data signals.

For example, in a case that the target data information includes a first set of data and a corresponding first target duration, and a second set of data and a corresponding second target duration, that is, when the number of sets of data in the target data information is two, the step S306 includes:

S3061: Triggering each of the second power supply modules to output a first data signal corresponding to the first set of data, and controlling an output duration of the first data signal to be equal to the first target duration based on the clock signal. The first data signal (or the first set of data) corresponding to each of the second power supply modules may be completely same, partially same, or not completely same. For example, the types of the first data signals are same, all of which are voltage signals or current signals, the frequencies are also completely same, and the effective values may be different or completely same. Furthermore, the first target duration of each of the second power supply modules is same.

S3062: In a case where the output duration of the first data signal is equal to the first target duration, triggering each of the second power supply modules to output a second data signal corresponding to the second set of data, and controlling an output duration of the second data signal to be equal to the second target duration based on the clock signal. When the output duration of the first data signal reaches the first target duration, it means that the output of the first data signal is completed, and at this moment, the second power supply module is automatically triggered to output the second data signal, and the output duration of the second data signal is controlled to be equal to the second target duration. Similarly, the second data signal (or the second set of data) of each of the second power supply modules may be completely same, partially same, or not completely same. For example, the types of the second data signals are same, all of which are voltage signals or current signals, the frequencies are also completely same, and the effective values may be different or completely same. Furthermore, the second target duration of each of the second power supply modules is same.

Figure 4:
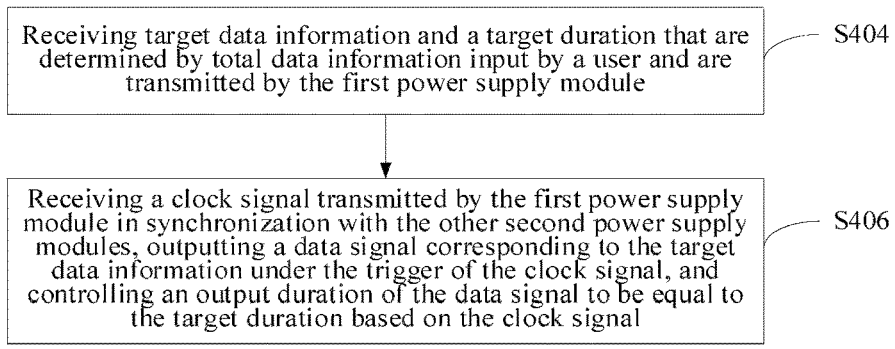
FIG. 4 is a flowchart illustrating a fourth synchronization method for multi-channel signals according to an embodiment of the present application.

A fourth implementation of the synchronization method for multi-channel signals according to an embodiment of the present application may be applied to a second power supply module, wherein each of the second power supply modules is mutually isolated and is connected to a first power supply module. As shown in FIG. 4, the synchronization method includes the following steps:

S404: Receiving target data information and a target duration that are determined by total data information input by a user and are transmitted by the first power supply module.

S406: Receiving a clock signal transmitted by the first power supply module in synchronization with the other second power supply modules, outputting a data signal corresponding to the target data information under the trigger of the clock signal, and controlling an output duration of the data signal to be equal to the target duration based on the clock signal.

After the target data information and the target duration are received, the second power supply module may store the target data information and the target duration.

In the synchronization method according to the embodiment of the present application, after receiving the target data information and the target duration, the second power supply module outputs a data signal corresponding to the target data information under the trigger of the clock signal transmitted by the first power supply module, and the output duration of the data signal is equal to the target duration, namely, the duration of the data signal is equal to the target duration.

The total data information may be pre-input by the user, and parsed by the first power supply module to obtain an allocation scheme for allocating the target data information and the target duration to each of the second power supply modules. The pre-input total data information may be directly input by the user to the first power supply module, or may be read and received by the first power supply module after being input by the user to the second power supply module. The first power supply module may include an input device, such as a touch interface, a keyboard, a mouse, etc., and correspondingly, the second power supply module may include an input device, such as a touch interface, a keyboard, a mouse, etc., and the user inputs the total data information via these input devices.

The target data information allocated to each of the second power supply modules by the first power supply module may be completely different, or may be partially same or completely same, while the target durations of all the second power supply modules are same, thereby enabling the output durations of the data signals output by the second power supply modules to be same.

The frequency of the clock signal synchronously received by each of the second power supply modules may be set according to demands, for example, 10 KHz, 5 KHz, or 15 KHz, etc. It may be appointed that the $N^{th}$ (N being 1, 2, 3, etc.) rising edge or falling edge of the clock signal triggers the second power supply modules to output data signals. Since the clock signal is synchronously received by each of the second power supply modules, each of the second power supply modules simultaneously outputs a corresponding data signal under the trigger of the clock signal, and times the output duration of the data signal according to the clock signal, so that the output duration is equal to the target duration. As the target duration allocated to each of the second power supply modules is same, the data signal output by each of the second power supply modules is cut off at the same time, thereby achieving the purpose of synchronizing the data signals output by all the second power supply modules.

The total data information includes at least one of the following of the data signal output by the second power supply module: a type, a waveform, a frequency, an average value, an effective value, or an amplitude. The type of the data signal may include a voltage signal or a current signal, and the waveform may be a sine wave, a rectangular wave, etc. When the type, the waveform, the frequency, etc., are included in the total data information input by the user, it means that the type, the waveform, the frequency, etc., can be selected; when the type, the waveform, the frequency, etc., are not included in the total data information, it means that the type, the waveform, the frequency, etc., are default. When the type of the data signal is a voltage signal, the effective value may be 10 volts, 5 volts, or 3 volts, etc. Further, the target duration may be 5 seconds, 30 seconds, 60 seconds, etc.

In an embodiment of the present application, the total data information input by the user may further include at least one of: number of sets of data in the target data information for each of the second power supply modules, a duration of each set of data in the target data information, number of cycles of the data signal, or a termination state of the second power supply module. The number of sets of data in the target data information for each of the second power supply modules may be one, two, three or more, and each of the second power supply modules correspondingly outputs a respective signal according to each set of data in the target data information, namely, each set of data corresponds to a respective signal, and the duration corresponding to each set of data may be same or different. The number of cycles of the data signal may be one, two, three or more, and after the output of the signal corresponding to each set of data in the target data information is completed for the first time, the signal corresponding to each set of data is output cyclically according to the number of cycles. The total number of signals output by each of the second power supply devices is equal to a product of the number of sets of data in the target data information for each of the second power supply modules and the number of cycles. In a case where the duration corresponding to each set of data in the target data information is same, a product of the duration corresponding to each set of data and the number of sets of data in the target data information and the number of cycles is equal to the target duration corresponding to the target data information.

The termination state of the second power supply modules refers to a state in which the second power supply device has completed the output of the total number of signals determined according to the total data information when the number of cycles is a limited value. The termination state includes turning off the output, or holding a signal corresponding to a last set of data in the target data information. Turning off the output means the output signal is zero, in other words, no signal is output. If a signal corresponding to the last set of data is a voltage signal having an effective value of 5 volts, or a current signal having an effective value of 1 ampere, and the termination state is selected to be a state of the signal corresponding to the last set of data in the target data information, the termination state is a voltage of 5 volts or a current of 1 ampere.

Figure 5:
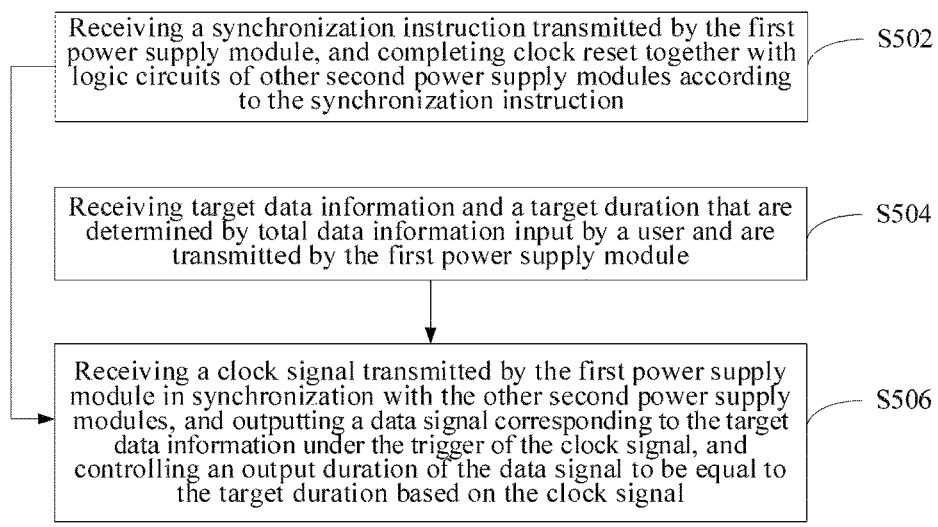
FIG. 5 is a flowchart illustrating a fifth synchronization method for multi-channel signals according to an embodiment of the present application.

As shown in FIG. 5, a fifth embodiment of the synchronization method according to an embodiment of the present application includes the following steps: S502, S504 and S506. The order of S502 and S504 may be that S502 precedes S504, S504 precedes S502, or S502 and S504 are performed simultaneously, which is not particularly limited in the embodiments of the present application.

S502: Receiving a synchronization instruction transmitted by the first power supply module, and completing clock reset together with logic circuits of other second power supply modules according to the synchronization instruction. After the clock is reset, all bits of the timer on the logic circuit of each of the second power supply modules are set to zero. The synchronization instruction received by the second power supply module from the first power supply module may be transmitted via a serial port, and the serial port may be a Serial Peripheral Interface (SPI), an Inter IC Bus (I2C), or a Universal Asynchronous Receiver Transmitter (URAT). In addition, other communications between the first power supply module and the second power supply module may also be achieved by means of the above-mentioned serial port.

S504: Receiving target data information and a target duration that are determined by total data information input by a user and are transmitted by the first power supply module.

S506: Receiving a clock signal transmitted by the first power supply module in synchronization with the other second power supply modules, outputting a data signal corresponding to the target data information under the trigger of the clock signal, and controlling an output duration of the data signal to be equal to the target duration based on the clock signal.

S504 may refer to S404, and S506 may refer to S406, which will not be described repeatedly herein.

Figure 6:
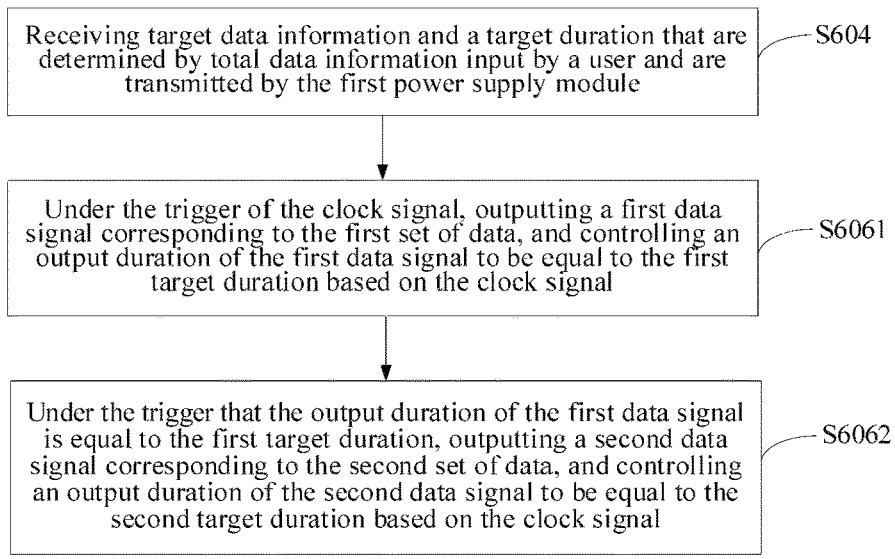
FIG. 6 is a flowchart illustrating a sixth synchronization method for multi-channel signals according to an embodiment of the present application.

As shown in FIG. 6, a sixth embodiment of the synchronization method according to an embodiment of the present application includes the following steps: S604 and 606.

S604: Receiving target data information and a target duration that are determined by total data information input by a user and are transmitted by the first power supply module.

S604 may refer to S404, which will not be described repeatedly herein. In S604, the target data information may include at least two sets (for example, two sets, three sets, four sets, etc.) of data and at least two sets (for example, two sets, three sets, four sets, etc.) of corresponding durations. In S606, data signals corresponding to each of several sets of data in the target data information are output in sequence according to the durations corresponding to the several sets of data, and the completion of the output of a previous set of data signals automatically triggers the output of a next set of data signals.

For example, in a case that the target data information includes a first set of data and a corresponding first target duration, and a second set of data and a corresponding second target duration, that is, when the number of sets of data in the target data information is two, the step S606 includes:

S6061: Under the trigger of the clock signal, outputting a first data signal corresponding to the first set of data, and controlling an output duration of the first data signal to be equal to the first target duration based on the clock signal. The first data signal (or the first set of data) corresponding to each of the second power supply modules may be completely same, partially same, or not completely same. For example, the types of the first data signals are same, all of which are voltage signals or current signals, the frequencies are also completely same, and the effective values may be different or completely same. Furthermore, the first target duration of each of the second power supply modules is same.

S6062: Under the trigger that the output duration of the first data signal is equal to the first target duration, outputting a second data signal corresponding to the second set of data, and controlling an output duration of the second data signal to be equal to the second target duration based on the clock signal. When the output duration of the first data signal reaches the first target duration, it means that the second power supply module has completed the output of the first data signal, is triggered to continue to output the second data signal, and controls the output duration of the second data signal to be equal to the second target duration. Similarly, the second data signal (or the second set of data) corresponding to each of the second power supply modules may be completely same, partially same, or not completely same.

For example, the types of the second data signals are same, all of which are voltage signals or current signals, the frequencies are also completely same, and the effective values may be different or completely same. Furthermore, the second target duration of each of the second power supply modules is same.

Figure 7:
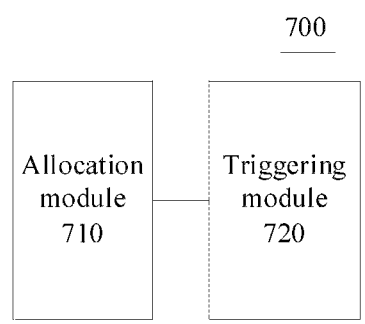
FIG. 7 is a schematic diagram illustrating modules of a power supply module according to an embodiment of the present application.

An embodiment of the present application further provides a power supply module. The power supply module includes a first power supply module 700. FIG. 7 is a schematic diagram illustrating modules of the first power supply module 700 according to the embodiment of the present application. The first power supply module 700 is connected to a plurality of mutually isolated second power supply modules 800, and the first power supply module 700 includes:
  an allocation module 710, configured to allocate target data information and a target duration to each of the second power supply modules according to total data information pre-input by a user; and
  a triggering module 720, configured to synchronously transmit a clock signal to each of the second power supply modules, and trigger each of the second power supply modules to output a data signal corresponding to the target data information, wherein an output duration of the data signal is equal to the target duration.

In an embodiment, the first power supply module 700 includes:
  a reset transmitting module, configured to transmit a synchronization instruction to each of the second power supply modules 800 to enable a logic circuit of each of the second power supply modules 800 to complete clock reset before synchronously transmitting a clock signal to each of the second power supply modules 800.

In an embodiment, the target data information includes at least one of a type, a waveform, a frequency, an average value, an effective value, or an amplitude of the data signal, and the type of the data signal includes a voltage signal or a current signal.

In an embodiment, the target data information includes a first set of data and a corresponding first target duration, and a second set of data and a corresponding second target duration.

The triggering module is specifically configured to trigger each of the second power supply modules 800 to output a first data signal corresponding to the first set of data, and control an output duration of the first data signal to be equal to the first target duration based on the clock signal; and
  in a case where the output duration of the first data signal is equal to the first target duration, to trigger each of the second power supply modules 800 to output a second data signal corresponding to the second set of data, and to control an output duration of the second data signal to be equal to the second target duration based on the clock signal.

In an embodiment, in allocating the target data information and the target duration to each of the second power supply modules 800, different second power supply modules 800 are allocated with same or different target data information.

The first power supply module 700 according to the embodiment of the present application can implement each process in FIGS. 1-3, and can achieve identical technical effect.

Figure 8:
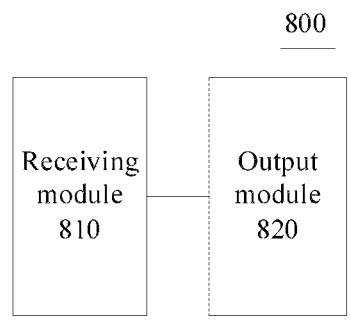
FIG. 8 is a schematic diagram illustrating modules of a power supply module according to an embodiment of the present application.

An embodiment of the present application further provides a power supply module. The power supply module includes a second power supply module 800. FIG. 8 is a schematic diagram illustrating modules of the second power supply module 800 according to the embodiment of the present application. At least two of the second power supply modules 800 are mutually isolated and are all connected to a first power supply module 700. The second power supply module 800 includes:
  a receiving module 810, configured to receive target data information and a target duration that are determined by total data information input by a user and are transmitted by the first power supply module 700; and
  an output module 820, configured to receive a clock signal transmitted by the first power supply module 700 in synchronization with the other second power supply modules 800, output a data signal corresponding to the target data information under the trigger of the clock signal, and control an output duration of the data signal to be equal to the target duration based on the clock signal.

In an embodiment, the second power supply module 800 further includes a reset execution module, configured to, before receiving the clock signal transmitted by the first power supply module 700, receive a synchronization instruction transmitted by the first power supply module 700, and complete clock reset together with logic circuits of other second power supply modules 800 according to the synchronization instruction.

In an embodiment, the target data information further includes at least one of a type, a waveform, a frequency, an average value, or an amplitude of the data signal, and the type of the data signal includes a voltage signal or a current signal.

In an embodiment, the target data information includes a first set of data and a corresponding first target duration, and a second set of data and a corresponding second target duration.

The output module is specifically configured to, under the trigger of the clock signal, output a first data signal corresponding to the first set of data, and control an output duration of the first data signal to be equal to the first target duration based on the clock signal, and is configured to, under the trigger that the output duration of the first data signal is equal to the first target duration, output a second data signal corresponding to the second set of data, and control an output duration of the second data signal to be equal to the second target duration based on the clock signal.

The second power supply module 800 according to the embodiment of the present application can implement each process in FIGS. 4-6, and can achieve identical technical effect.

The present application further provides a power supply device. The power supply device may include the above-mentioned first power supply module 700 and second power supply module 800, and can achieve identical technical effect as that of the first power supply module 700 and the second power supply module 800. In the power supply device, the first power supply module 700 serves as a host, and the second power supply module 800 serves as a slave, and they can communicate with each other via a serial port.

In an embodiment, the first power supply module 700 may include a microprocessor, and the second power supply module 800 includes a sub-channel board. The sub-channel board includes a serial interface, a FPGA chip, a DAC, an ADC, a storage unit, and an isolated power supply. The microprocessor transmits data to the sub-channel board via the serial interface. The microprocessor may be an ARM board, or a single chip microcomputer board, etc.

The power supply device is configured to enable the synchronous output of multi-channel voltage or current signals, and can enable the synchronous output of voltage or current signals as follows: 1) voltage or current values to be synchronously output by multi-channel voltage or current signals are transmitted by an ARM board via a serial port UART, and a FPGA chip receives data and stores the data in a storage unit FLASH; 2) when the storage of the voltage or current values is completed, the ARM board transmits a synchronization signal via the serial port, and after receiving the synchronization signal, the FPGA chips in the multiple channel boards simultaneously reset clock counters of corresponding TIMER modules; 3) the ARM board generates a SYNC clock signal and transmits the SYNC clock signal to multiple channel boards at the same time; the clock counter of the TIMER module in the FPGA chip counts according to the SYNC clock signal and compares with the setting time of current data to output current voltage or current value; and when the setting time of current data is equal to time of the counter, the counter resets and performs counting update and data transmitting for a next set of setting time until the data transmitting is completed.

Figure 9:
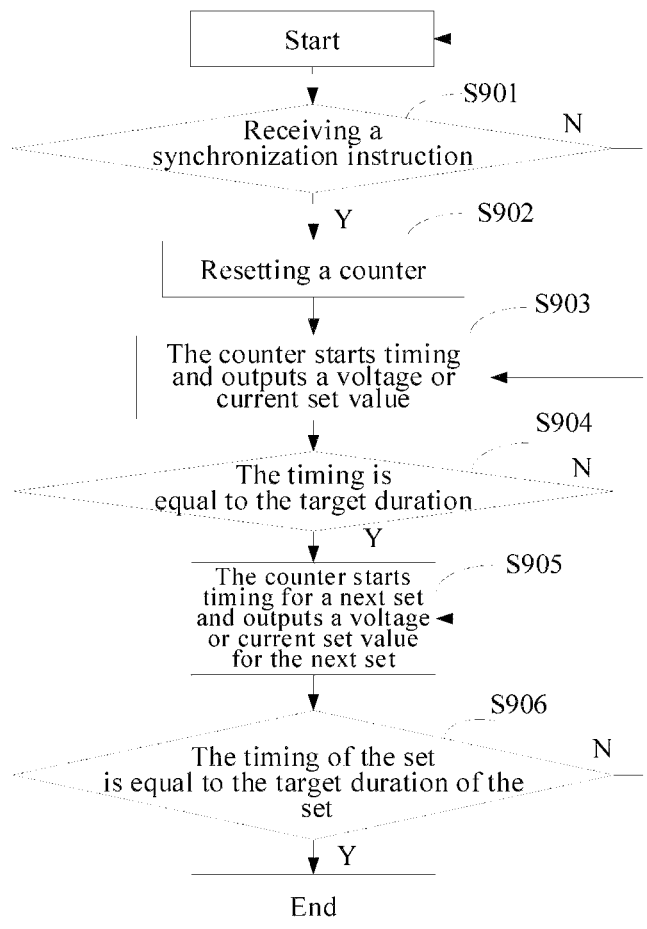
FIG. 9 is a schematic diagram illustrating an operation flow of a power supply device according to an embodiment of the present application.

FIG. 9 shows an operation flow of a power supply device. Each of the second power supply modules determines whether a synchronization instruction is received (S901). After it is determined that the synchronization instruction is received, a counter of the second power supply module is reset (S902). A voltage or current set value is output based on pre-received target data information according to a clock signal of a first power supply module (S903). Then, it is periodically determined whether a clock count is equal to a target duration of the current set based on the pre-received target duration (S904). If yes, it is indicated that an output duration of the voltage or current set value reaches the target duration, if no, the counter continues timing, and the voltage or current set value is kept to be output. When the count of the counter reaches the target duration, timing is started, and a voltage or current set value of a next set is output (S905), and whether the clock count is equal to the target duration of the set is periodically determined (S906), and when the two are equal, the voltage or current set value of the next set continues being output until the end; if the two are not equal, for the same reason, the counter continues timing and the output of the set of voltage or current value is kept.

In periodically determining whether the clock count is equal to the target duration of the current set, the determining frequency may be determined by the frequency of the clock signal.

The present application further provides an electronic device, including a processor, a memory, and a program or instructions stored on the memory and executable by the processor. When executed by the processor, the program or instructions implement each of the processes as shown in FIGS. 1-6. The electronic device may be a mobile terminal or the like for controlling a cleaning device.

The present application further provides a computer-readable storage medium stored with a control program for the cleaning device. When the control program of the first power supply module or the second power supply module is executed by a processor, the processes of the above-mentioned control method can be implemented, and identical technical effects can be achieved. In order to avoid repetition, the description thereof will not be repeated. The computer readable storage medium may be, for example, a Read-Only Memory (ROM), a Random Access Memory (RAM), a magnetic disk or an optical disk, etc.

It should be noted that all the embodiments provided in the present application belong to the same concept; the technical features in the technical solutions described in each embodiment can be combined in any combination without any conflict. The foregoing is only examples of the present application and are not intended to limit the present application. Various modifications and alterations to this application will become apparent to a person skilled in the art. Any modifications, equivalent substitutions, improvements, etc. made within the spirit and principles of the present application shall be included in the scope of the claims of the present application.

What is claimed is:

1. A synchronization method for multi-channel signals, applied to a first power supply module, wherein the first power supply module is connected to at least two mutually isolated second power supply modules, the method comprises:
   allocating target data information and a same target duration to each of the second power supply modules according to total data information pre-input by a user, and
   synchronously transmitting a clock signal to each of the second power supply modules, and triggering each of the second power supply modules to output a data signal corresponding to the target data information with an output duration of the data signal being controlled to be equal to the target duration based on the clock signal,
   wherein in the step of allocating target data information and a target duration to each of the second power supply modules, different second power supply modules are allocated with same or different target data information.

2. The synchronization method according to claim 1, wherein before synchronously transmitting a clock signal to each of the second power supply modules, the method further comprises:
   transmitting a synchronization instruction to each of the second power supply modules to enable a logic circuit of each of the second power supply modules to complete clock reset.

3. The synchronization method according to claim 1, wherein the total data information comprises at least one of a type, a waveform, a frequency, an average value, an effective value, or an amplitude of the data signal, and the type of the data signal comprises a voltage signal and/or a current signal.

4. The synchronization method according to claim 1, wherein the total data information comprises at least one of the following: number of sets of data in the target data information for each of the second power supply modules, a duration corresponding to each set of data in the target data information, number of cycles of the data signal, and a termination state of the second power supply module, wherein the termination state comprises turning off output, or holding a signal corresponding to a last set of data in the target data information.

5. The synchronization method according to claim 1, wherein the target data information comprises a first set of data and a corresponding first target duration, and a second set of data and a corresponding second target duration; and
   the triggering each of the second power supply modules to output a data signal corresponding to the target data information with an output duration of the data signal being equal to the target duration, comprises:
   triggering each of the second power supply modules to output a first data signal corresponding to the first set of data, and controlling an output duration of the first data signal to be equal to the first target duration based on the clock signal; and in a case where the output duration of the first data signal is equal to the first target duration, triggering each of the second power supply modules to output a second data signal corresponding to the second set of data, and controlling an output duration of the second data signal to be equal to the second target duration based on the clock signal.

6. A synchronization method for multi-channel signals, applied to a second power supply module, wherein at least two second power supply modules are mutually isolated and are connected to a first power supply module, the method comprises:

receiving target data information and a target duration that are determined according to total data information input by a user and are transmitted by the first power supply module, wherein the target data information received by each of the second power supply modules are same or different, and each of the second power supply modules is allocated with a same target duration; and receiving a clock signal transmitted by the first power supply module in synchronization with the other second power supply modules, outputting a data signal corresponding to the target data information under the trigger of the clock signal, and controlling an output duration of the data signal to be equal to the target duration based on the clock signal.

7. The synchronization method according to claim 6, wherein before receiving a clock signal transmitted by the first power supply module, the method further comprises:

receiving a synchronization instruction transmitted by the first power supply module, and completing clock reset together with logic circuits of the other second power supply modules according to the synchronization instruction.

8. The synchronization method according to claim 6, wherein the total data information further comprises at least one of a type, a waveform, a frequency, an average value, an effective value, or an amplitude of the data signal, and the type of the data signal comprises a voltage signal and/or a current signal.

9. The synchronization method according to claim 6, wherein the total data information comprises at least one of the following: number of sets of data in the target data information for each of the second power supply modules, a duration corresponding to each set of data in the target data information, number of cycles of the data signal, and a termination state of the second power supply module, wherein the termination state comprises turning off output, or holding a signal corresponding to a last set of data in the target data information.

10. The synchronization method according to claim 6, wherein the target data information comprises a first set of data and a corresponding first target duration, and a second set of data and a corresponding second target duration, the outputting a data signal corresponding to the target data information under the trigger of the clock signal, and controlling an output duration of the data signal to be equal to the target duration based on the clock signal comprises:

outputting a first data signal corresponding to the first set of data under the trigger of the clock signal, and controlling an output duration of the first data signal to be equal to the first target duration based on the clock signal; and under the trigger that the output duration of the first data signal is equal to the first target duration, outputting a second data signal corresponding to the second set of data, and controlling an output duration of the second data signal to be equal to the second target duration based on the clock signal.

11. A power supply module, comprising a first power supply module, wherein the first power supply module is connected to a plurality of mutually isolated second power supply modules, and the first power supply module comprises:

an allocation module, configured to allocate target data information and a same target duration to each of the second power supply modules according to total data information pre-input by a user, wherein different second power supply modules are allocated by the allocation module with same or different target data information; and a triggering module, configured to synchronously transmit a clock signal to each of the second power supply modules, and trigger each of the second power supply modules to output a data signal corresponding to the target data information with an output duration of the data signal being controlled to be equal to the target duration based on the clock signal.

12. An electronic device, comprising: a memory, a processor, and a computer program stored on the memory and executable by the processor, wherein, when executed by the processor, the computer program implements steps of the method according to claim 1.

13. A computer readable storage medium, wherein the computer readable storage medium is stored with a computer program, and wherein, when executed by a processor, the computer program implements steps of the method according to claim 1.

14. A power supply device, comprising the power supply module according to claim 11, and a second power supply module connected to the first power supply module in the power supply module, wherein the first power supply module comprises a microprocessor, and the second power supply module comprises a sub-channel board, wherein the sub-channel board comprises a serial interface, a field programmable gate array (FPGA) chip, a digital-to-analogue converter (DAC), an analogue-to-digital converter (ADC), a storage unit and an isolated power supply, and wherein the microprocessor transmits data to the sub-channel board via the serial interface.

* * * * *